United States Patent
Rahul et al.

(10) Patent No.: US 10,725,841 B1
(45) Date of Patent: Jul. 28, 2020

(54) METHOD AND APPARATUS FOR ERROR DETECTION AND CORRECTION

(71) Applicant: Xilinx, Inc., San Jose, CA (US)

(72) Inventors: Kumar Rahul, Hyderabad (IN); Santosh Yachareni, Hyderabad (IN)

(73) Assignee: XILINX, INC., San Jose, CA (US)

( * ) Notice: Subject to any disclaimer, the term of this patent is extended or adjusted under 35 U.S.C. 154(b) by 112 days.

(21) Appl. No.: 15/844,919

(22) Filed: Dec. 18, 2017

(51) Int. Cl.
*G06F 11/00* (2006.01)
*H03M 13/09* (2006.01)
*H03M 13/27* (2006.01)
*H03M 13/19* (2006.01)

(52) U.S. Cl.
CPC ......... *G06F 11/004* (2013.01); *H03M 13/098* (2013.01); *H03M 13/271* (2013.01); *H03M 13/2742* (2013.01); *H03M 13/19* (2013.01)

(58) Field of Classification Search
None
See application file for complete search history.

(56) References Cited

U.S. PATENT DOCUMENTS

| | | | | |
|---|---|---|---|---|
| 4,547,882 A * | 10/1985 | Tanner | ............... | G06F 11/1076 714/755 |
| 6,604,222 B1 * | 8/2003 | Jensen | ................. | H03M 13/17 714/785 |
| 7,610,523 B1 * | 10/2009 | Singh | .................... | G11C 29/42 365/200 |
| 8,972,833 B1 * | 3/2015 | Rahul | ................. | H03M 13/098 714/785 |
| 8,972,835 B1 * | 3/2015 | Rahul | ................... | H03M 13/19 714/800 |
| 2010/0223525 A1 * | 9/2010 | Wuu | ................... | G06F 11/1064 714/755 |
| 2011/0103400 A1 * | 5/2011 | Wezelenburg | ........ | H03M 13/19 370/474 |
| 2011/0119559 A1 * | 5/2011 | Kamoshida | ........... | H03M 13/19 714/758 |
| 2012/0027149 A1 * | 2/2012 | Mutchnik | ............... | H04L 7/042 375/365 |
| 2013/0073921 A1 * | 3/2013 | Kamoshida | ............ | H03M 13/11 714/758 |
| 2013/0262957 A1 * | 10/2013 | Wu | ..................... | G06F 11/1064 714/763 |
| 2013/0268822 A1 * | 10/2013 | Manoochehri | ........ | H03M 13/29 714/758 |
| 2014/0047296 A1 * | 2/2014 | Motabar | ............. | G06F 11/1048 714/758 |
| 2014/0173379 A1 * | 6/2014 | Loh | ..................... | G06F 11/1064 714/764 |
| 2016/0134307 A1 * | 5/2016 | Hu | ......................... | G11C 29/52 714/758 |
| 2019/0006001 A1 * | 1/2019 | Chun | ................ | G11C 11/40607 |

* cited by examiner

*Primary Examiner* — Mujtaba M Chaudry
(74) *Attorney, Agent, or Firm* — Patterson + Sheridan, LLP

(57) ABSTRACT

An integrated circuit (IC) includes an encoder circuit configured to receive input data including a plurality of data bits. A plurality of parity computation equations for a single error correct double error detect adjacent double error correct adjacent triple error detect (SECDEDADECADTED) Hamming code is received. A plurality of parity bits are computed using the plurality of parity computation equations. Write data including the data bits and the parity bits are provided to a write circuit. The write circuit writes the write data to a memory.

20 Claims, 13 Drawing Sheets

| SINGLE BIT ERROR (SBITERR) 512 | DOUBLE BIT ERROR (DBITERR) 514 | ADJACENT TRIPLE BIT ERROR (TBITERR) 516 | ERROR STATUS 602 |
|---|---|---|---|
| 0 | 0 | 0 | NO ERROR DETECT |
| 1 | 0 | 0 | SINGLE BIT ERROR DETECT AND CORRECT |
| 0 | 1 | 0 | DOUBLE BIT ERROR DETECT/ADJACENT-DOUBLE_BIT ERROR DETECT AND CORRECT |
| 0 | 0 | 1 | ADJACENT-TRIPLE-BIT ERROR DETECT |

METHOD AND APPARATUS FOR ERROR DETECTION AND CORRECTION

TECHNICAL FIELD

Examples of the present disclosure generally relate to integrated circuits ("ICs") and, in particular, to an embodiment related to error detection and correction and more particularly to detecting and correcting errors in a memory.

BACKGROUND

The capability to store data in memory devices improves with advances in technology. However, wear of a memory element of a memory may occur due to writes, reads, erases, and other memory operations to the memory element. When a memory element experiences excessive wear, it may cease to be a reliable storage element.

Error detection and correction may be applied using error correction codes (ECC) to stored data and may detect and/or correct errors that have corrupted the stored data. Error detection and correction consumes time and computing resources. Reducing error correction computing time would result in greater computing efficiency.

Accordingly, it would be desirable and useful to provide an area efficient ECC with improved performance and resource utilization.

SUMMARY

In some embodiments in accordance with the present disclosure, a system includes an encoder circuit configured to: receive input data including a plurality of data bits; receive a plurality of parity computation equations for a single error correct double error detect adjacent double error correct adjacent triple error detect (SECDEDADECADTED) Hamming code; compute a plurality of parity bits using the plurality of parity computation equations; and provide write data including the data bits and the parity bits to a write circuit, wherein the write circuit writes the write data to a memory.

In some embodiments, the SECDEDADECADTED Hamming code includes n1 parity bits and m1 data bits, wherein n1, m1, and e1 are integers, wherein e1 is equal to or greater than 2, and wherein $2^{n1-e1}-n1-1>=m1$.

In some embodiments, n1 equals 13, m1 is between 1013 and 2036, and e1 equals 2.

In some embodiments, the system includes a decoder configured to receive read data that are read from the memory. The decoder includes: a syndrome computation circuit configured to: receive a plurality of syndrome computation equations for the SECDEDADECADTED Hamming code; compute syndrome bits using the plurality of syndrome computation equations and the read data; and an error detection and correction circuit configured to: decode the read data to generate decoded read data according to the syndrome bits.

In some embodiments, the error detect and correction circuit is configured to: provide one or more error status signals including a single bit error status signal, a double bit error status signal, and a triple bit error status signal.

In some embodiments, the error detection and correction circuit is configured to: detect a single bit error in the read data and in response, correcting the single bit error using the syndrome bits.

In some embodiments, in response to detecting and correcting the single bit error, the error detection and correction circuit is configured to: provide the single bit error status signal having a value of one; provide the double bit error status signal having a value of zero; and provide the triple bit error status signal having a value of zero.

In some embodiments, the error detection and correction circuit is configured to: detect a double bit error in the read data; and in response to detecting the double bit error, provide the double bit error status signal having a value of one.

In some embodiments, the error detection and correction circuit is configured to: detect an adjacent double bit error in the read data and in response, correct the adjacent double bit error using the syndrome bits.

In some embodiments, in response to detecting and correcting the adjacent double bit error, the error detection and correction circuit is configured to: provide the single bit error status signal having a value of zero; provide the double bit error status signal having a value of one; and provide the triple bit error status signal having a value of zero.

In some embodiments, the error detection and correction circuit is configured to: detect a triple-adjacent-bit error in the read data.

In some embodiments, in response to detecting the triple-adjacent-bit error, the error detection and correction circuit is configured to: provide the single bit error status signal having a value of zero; provide the double bit error status signal having a value of zero; and provide the triple bit error status signal having a value of one.

In some embodiments, the system includes a hamming code generator circuit configured to: determine a code matrix for the SECDEDADECADTED Hamming code including its single bit error syndrome locations, adjacent double bit error syndrome locations, and adjacent triple bit error syndrome locations; generate the plurality of parity computation equations based on the single bit error syndrome locations; and provide, to the encoder circuit, the plurality of parity computation equations.

In some embodiments, the single bit error syndrome locations, adjacent double bit error syndrome locations, and adjacent triple bit error syndrome locations are in an n1-syndrome-bit space. Each single bit error syndrome location is different from another single bit error syndrome location. Each adjacent double bit error syndrome location is different from another adjacent double bit error syndrome location. Each single bit error syndrome location is different from another adjacent triple bit error syndrome location.

In some embodiments, the hamming code generator circuit is configured to: generate a plurality of syndrome computation equations based on the single bit error syndrome locations; and provide, to an decoder circuit, the code matrix and the plurality of syndrome computation equations for decoding read data read from the memory.

In some embodiments, a method includes receiving, by an encoder circuit, input data including a plurality of data bits; receiving, by the encoder circuit, a plurality of parity computation equations for a single error correct double error detect adjacent double error correct adjacent triple error detect (SECDEDADECADTED) Hamming code; computing, by the encoder circuit, a plurality of parity bits using the plurality of parity computation equations; and providing, by the encoder circuit, write data including the data bits and the parity bits to a write circuit, wherein the write circuit writes the write data to a memory.

In some embodiments, the method includes receiving, by a decoder circuit, read data that are read from the memory; receiving a plurality of syndrome computation equations for the SECDEDADECADTED Hamming code; computing syndrome bits using the plurality of syndrome computation equations and the read data; and decoding the read data to generate decoded read data according to the syndrome bits.

In some embodiments, the method includes providing one or more error status signals including a single bit error status signal, a double bit error status signal, and a triple bit error status signal.

In some embodiments, the method includes detecting an adjacent double bit error in the read data and in response, correcting the adjacent double bit error using the syndrome bits; and in response to detecting and correcting the adjacent double bit error, providing the single bit error status signal having a value of zero, and providing the triple bit error status signal having a value of zero.

In some embodiments, the method includes: detecting a triple-adjacent-bit error in the read data; in response to detecting the triple-adjacent-bit error, providing the single bit error status signal having a value of zero, providing the double bit error status signal having a value of zero, and providing the triple bit error status signal having a value of one.

In some embodiments, the method includes: determining a code matrix for the SECDEDADECADTED Hamming code including its single bit error syndrome locations, adjacent double bit error syndrome locations, and adjacent triple bit error syndrome locations; and generating the plurality of parity computation equations based on the single bit error syndrome locations.

In some embodiments, a method includes determining single bit error syndrome locations of a code matrix for n1 parity bits and m1 data bits of an SECDEDADECADTED Hamming code; determining adjacent double bit error syndrome locations of the code matrix; determining adjacent triple bit error syndrome locations of the code matrix, wherein the single bit error syndrome locations, adjacent double bit error syndrome locations, and adjacent triple bit error syndrome locations are in an n1-syndrome-bit space, wherein each single bit error syndrome location is different from another single bit error syndrome location, wherein each adjacent double bit error syndrome location is different from another adjacent double bit error syndrome location, and wherein each single bit error syndrome location is different from another adjacent triple bit error syndrome location; generating a plurality of parity computation equations based on the single bit error syndrome locations; and providing, to an encoder, the plurality of parity computation equations, for generating encoded data to write to a memory.

In some embodiments, the method includes generating a plurality of syndrome computation equations based on the single bit error syndrome locations; and providing, to a decoder, the code matrix and the plurality of syndrome computation equations for decoding read data read from a memory.

Other aspects and features will be evident from reading the following detailed description and accompanying drawings.

BRIEF DESCRIPTION OF THE DRAWINGS

FIG. 10 is a listing diagram listing exemplary parity computation equations according to some embodiments of the present disclosure.

FIG. 12 is a listing diagram listing exemplary syndrome computation equations according to some embodiments of the present disclosure.

DETAILED DESCRIPTION

Figure 1:
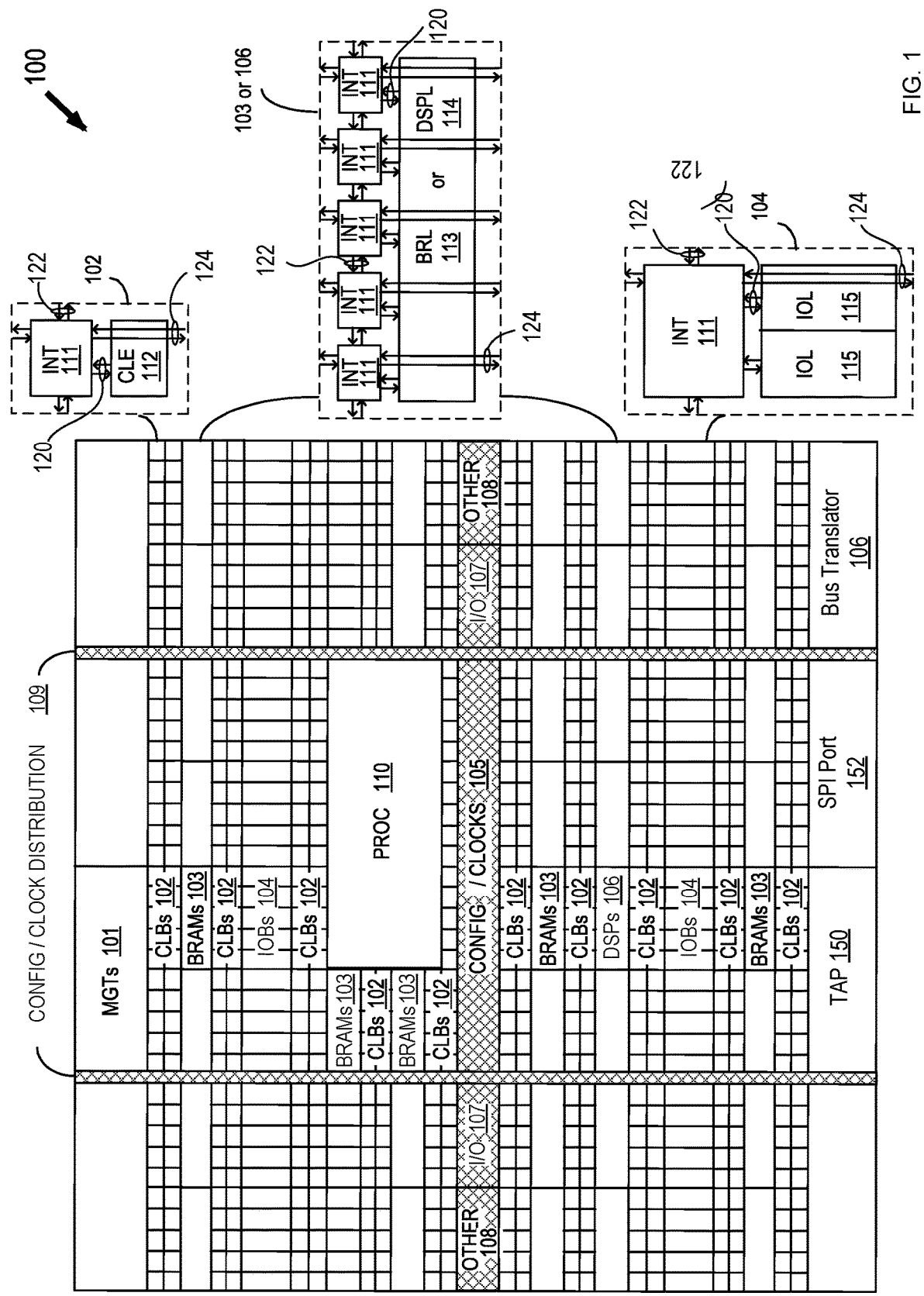
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. An error correction code (ECC) in a memory may add parity bits (check bits, protection bits) to each word stored in a memory array of the memory. During a write operation to the memory, parity bits are generated and stored along with the data bits of the word. When a Hamming code used, during a read operation, these parity bits may be used to detect and correct any single bit error, or to detect (but not correct) any double bit error. In an example, where a (1612, 1600) Hamming code is used, for each word having 1600 data bits, 12 parity bits are used to detect and correct a single bit error. In that example, 4:1 column multiplexing may be used to detect and correct four adjacent error bits in four different words respectively in four clock cycles. As the technology node decreases, the size of memory cells (e.g., a single-level cell (SLC), a multi-level cell (SMC)) reduces, which increases the probability of that a single event upset (SEU) event flipping more memory cells significantly. In an example where an SEU event upsets five to eight adjacent SLCs, that SEU event may cause one or more (e.g., one, two, three, four) sets of adjacent double bit errors. In that example, the ECC (1612, 1600) Hamming code may only detect the corresponding adjacent double bit errors but may not correct those errors. In another example where an SEU event upsets more than eight consecutive SLCs, the SEU event may cause one or more (e.g., one, two, three, four) sets of triple-adjacent-bit errors. In that example, the ECC (1612, 1600) Hamming code may not detect any corresponding triple-adjacent-bit error. In an example where a configuration memory of a programmable logic device (PLC) uses such an ECC (1612, 1600) Hamming code, the configuration for that PLC using the configuration memory may fail because of those SEU events, rendering its user design unusable.

For integrated circuit (IC) solutions, it has been discovered that, by using an enhanced Hamming code (e.g., with an ECC (1613, 1600) Hamming code) including one or more additional parity bits than a single extended Hamming code (e.g., an ECC (1612, 1600) Hamming code), the enhanced Hamming code may be used for both single error correct double error detect adjacent double error correct (SECDEDADEC) and single error correct double error detect adjacent double error correct adjacent triple error detect (SECDEDADECADTED). For example, compared to ECC (1612, 1600) Hamming code for single error correct double error detect (SECDED), the expanded ECC (1613, 1600) Hamming code uses one additional parity bit, and may detect and correct four sets of adjacent double bit errors in four clock cycles, and may detect four sets of triple-adjacent-bit errors in four clock cycles.

Various advantages may be present in various applications of the present disclosure. No particular advantage is required for all embodiments, and different embodiments may offer different advantages. One of the advantages of some embodiments is that by using one additional parity bit (e.g., with an ECC (1613, 1600) Hamming code), the expanded Hamming code may be used for both SECDEDADEC and SECDEDADECADTED. Such an expanded Hamming code improves memory performance (e.g., where an SEU event upsets more than four (e.g., five to twelve) adjacent SLCs in a memory). Another of the advantages of some embodiments is that while cyclic error-correcting codes (e.g., Bose-Chaudhuri-Hocquenghem (BCH) (1624, 1600, 2)) may be used in the ECC, they may use twice the parity bits of the expanded Hamming code. As such, by using the expanded Hamming code, area and power savings are achieved. Yet another of the advantages of some embodiments is that the expanded Hamming code is computationally efficient. For example, the ECC (1613, 1600) Hamming code may be 1.5 times faster than an ECC using BCH (1624, 1600, 2) or ECC (1622, 1600, 2).

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC.

Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the error detection and correction is not limited to the exemplary IC depicted in FIG. 1, and that IC having other configurations, or other types of IC, may also implement the error detection and correction.

In various embodiments, Hamming codes are used on computer memory systems for error correction. Hamming codes are a family of linear error-correcting codes. In basic Hamming codes (e.g., Hamming code (1611, 1600) having 1600 data bits and 11 parity bits), n1 parity bits may cover up to m1 data bits, and n1 is the least integer that satisfies: $2^{n1}-n1-1>=m1$. Basic Hamming codes have a minimum distance of 3, which means that the decoder can detect and correct a single error, but it cannot distinguish a double bit error of some codeword from a single bit error of a different codeword. Thus, some double bit errors will be incorrectly decoded as if they were single bit errors and therefore go undetected, unless no correction is attempted. To remedy this shortcoming, a single-extended Hamming code (e.g., Hamming code (1612, 1600) having 1600 data bits and 12 parity bits) includes an extra parity bit than the corresponding basic Hamming code. In a single-extended Hamming code, n1 parity bits may cover up to m1 data bits, and n1 is the least integer that satisfies: $2^{n1-1}-n1-1>=m1$.

Referring to FIGS. 2 through 12, in some embodiments, an error correction code (ECC) for a storage unit (e.g., a memory) may be implemented using an enhanced Hamming code. An enhanced Hamming code may include one or more parity bits than the single-extended Hamming code. In an enhanced Hamming code, n1 parity bits may cover up to m1 data bits, and n1 is the least integer that satisfies: $2^{n1-e1}-n1-1>=m1$, where e1 indicates the number of additional parity bits compared to the corresponding basic Hamming code, and e1 is equal to or greater than 2. An enhanced Hamming code where e1 equals to two may also be referred to as a double-extended Hamming code. In the description below, a double-extended Hamming code (1613, 1600) where n1 equals 13, m1 equals 1600, and e1 equals to 2 is used as an example. The Hamming code (1613, 1600) is exemplary, and it will be understood by those skilled in that art that Hamming codes with other configurations with n1, m1, and e1 may be used.

In various embodiments, the double-extended Hamming code (1613, 1600) may be used in an ECC to detect no error, detect and correct single bit error, detect double bit error, detect and correct double-adjacent bit error, and detect triple-adjacent-bit error. Such an SECDEDADECADTED Hamming code (1613, 1600) satisfies the following syndrome conditions:

First syndrome condition: The syndrome corresponding to each single bit error is unique, such that the ECC may detect and correct every single bit error.

Second syndrome condition: The syndrome corresponding to each two-adjacent-bit error is unique, such that the ECC may detect and correct every two-adjacent-bit error.

Third syndrome condition: Syndromes corresponding to triple-adjacent-bit errors may share a common syndrome space, as the ECC detects the triple-adjacent-bit errors without correcting it.

Fourth syndrome condition: The single bit error syndrome and the adjacent double bit error syndrome may share the common space, because there is one parity bit to detect the double bit error that may be used to distinguish the adjacent double bit error with the single bit error.

Fifth syndrome condition: The single bit error syndrome and the triple-adjacent-bit error syndrome do not share the common signature. In other words, none of the single bit error syndrome matches with any of the adjacent-three-bit error syndromes.

Sixth syndrome condition: The two-adjacent-bit error syndrome may share the common signature with the triple-adjacent-bit error syndrome. An extra parity bit (e.g., a global parity bit P[12] of a Hamming code (1613, 1600)) may be used to distinguish between the even and odd number of bits in error.

Figure 2:
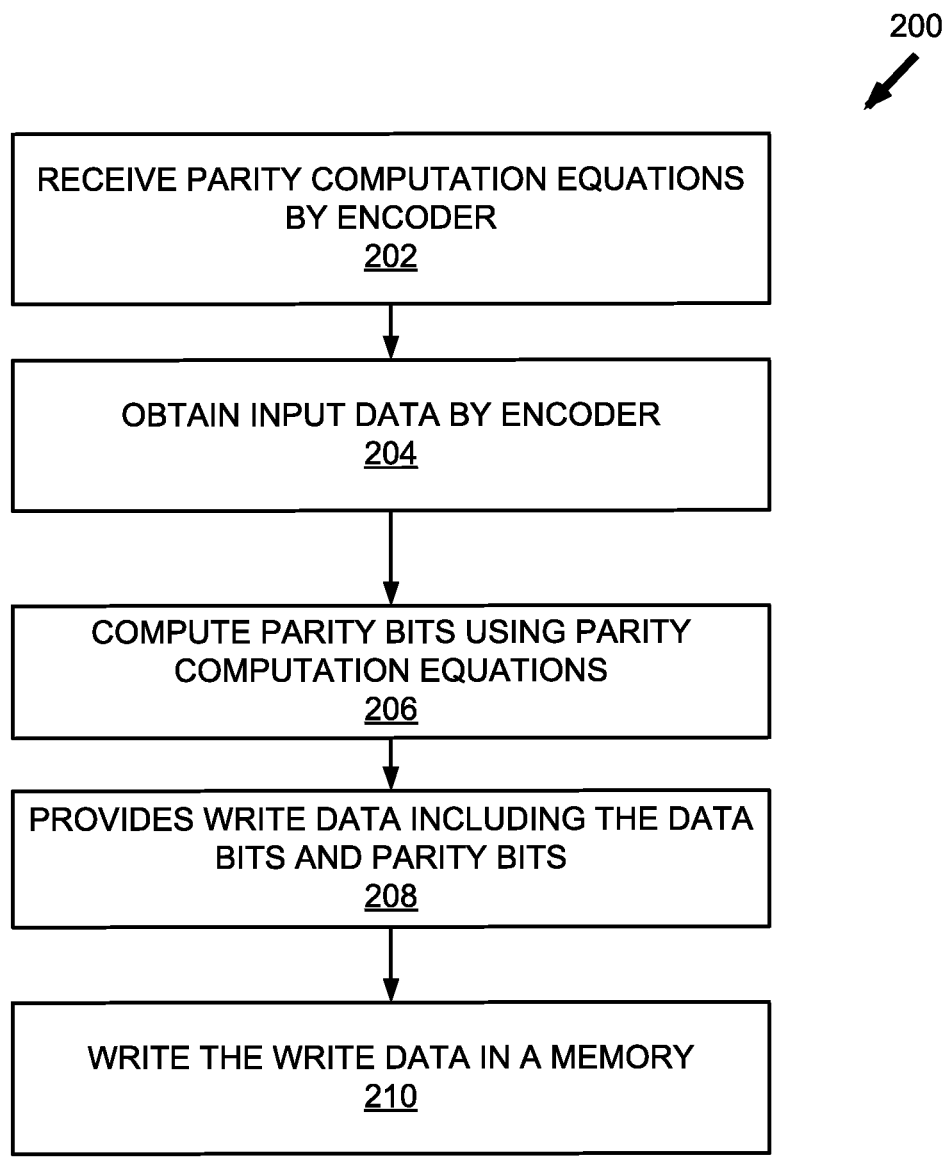
FIG. 2 is a flow diagram illustrating an exemplary method for performing an encoding method according to some embodiments of the present disclosure.
Figure 3:
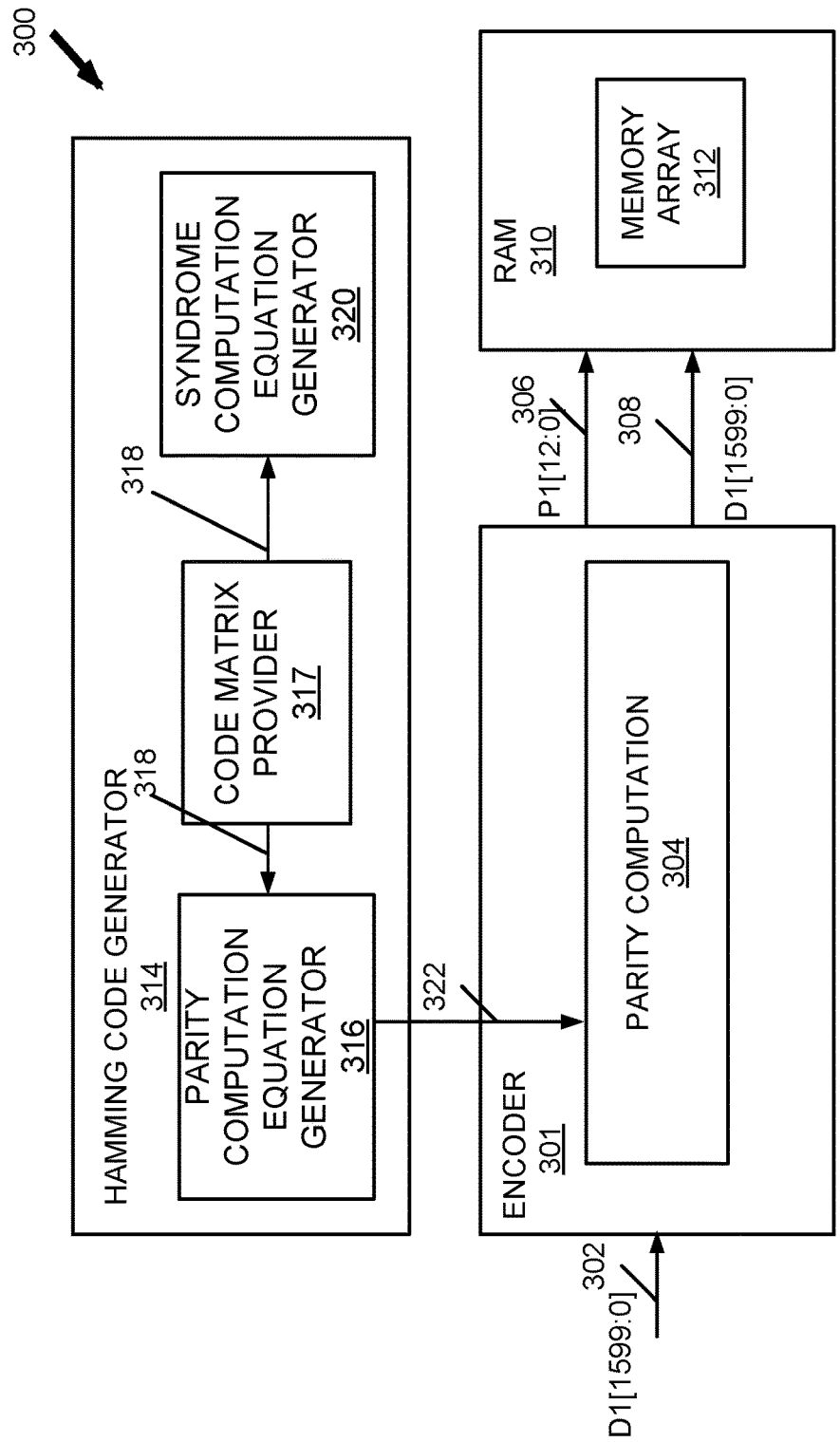
FIG. 3 is a block diagram illustrating an exemplary embodiment of a portion of an error-correcting code (ECC) memory system according to some embodiments of the present disclosure.

Referring to FIGS. 2 and 3, an embodiment of an encoding method 200 using an SECDEDADECADTED Hamming code (1613, 1600). Referring to FIG. 2, the method 200 begins at block 202, where an encoder receives parity computation equations of the Hamming code (1613, 1600). Referring to FIG. 3, an ECC memory system 300 includes a Hamming code generator 314, an encoder 301, and a memory 310. The Hamming code generator 314 includes a code matrix provider 317 providing a code matrix 318 for the Hamming code (1613, 1600), a parity computation equation generator 316, and a syndrome computation equation generator 320. The parity computation equation generator 316 generates parity computation equations 322 based on the code matrix 318, and sends them to the encoder 301. At block 202, the parity computation unit 304 of the encoder 301 receives the parity computation equations 322 from the parity computation equation generator 316. In the example of FIG. 3, because the Hamming code (1613, 1600) uses 13 parity bits, 13 parity computation equations 322 are provided for the 13 parity bits respectively.

The method 200 may then proceed to block 204, where the encoder obtains input data. Referring to FIG. 3, at block 204, the encoder 301 obtains a signal 302 including input data D1[1599:0] to be written to a memory 310 (e.g., a random-access memory (RAM) 310).

The method 200 may then proceed to block 206, where parity bits are computed based on the parity computation equations 322 and the input data D1[1599:0]. Referring to FIG. 3, in the encoder 301, the parity computation unit 304 may compute parity bits based on the parity computation equations 322. In the example of FIG. 3, 13 parity bits P1[12:0] are computed using the 13 parity computation equations 322 respectively.

The method 200 may then proceed to block 208, where the encoder 301 provides write data (encoded data) including the data bits D1[1599:0] and the parity bits P1[12:0]. As shown in FIG. 3, the encoder 301 may output a signal 306 providing the parity bits P1[13:0], and output a signal 308 providing the data bits D1[1599:0].

The method 200 may then proceed to block 210, where the write data may be written in a memory. Referring to FIG. 3, the memory 310 may receive the write data including D1[1599:0] and P1[12:0], and write the write data to a memory array 312 (e.g., by a write circuit coupled to the memory 310).

Figure 4:
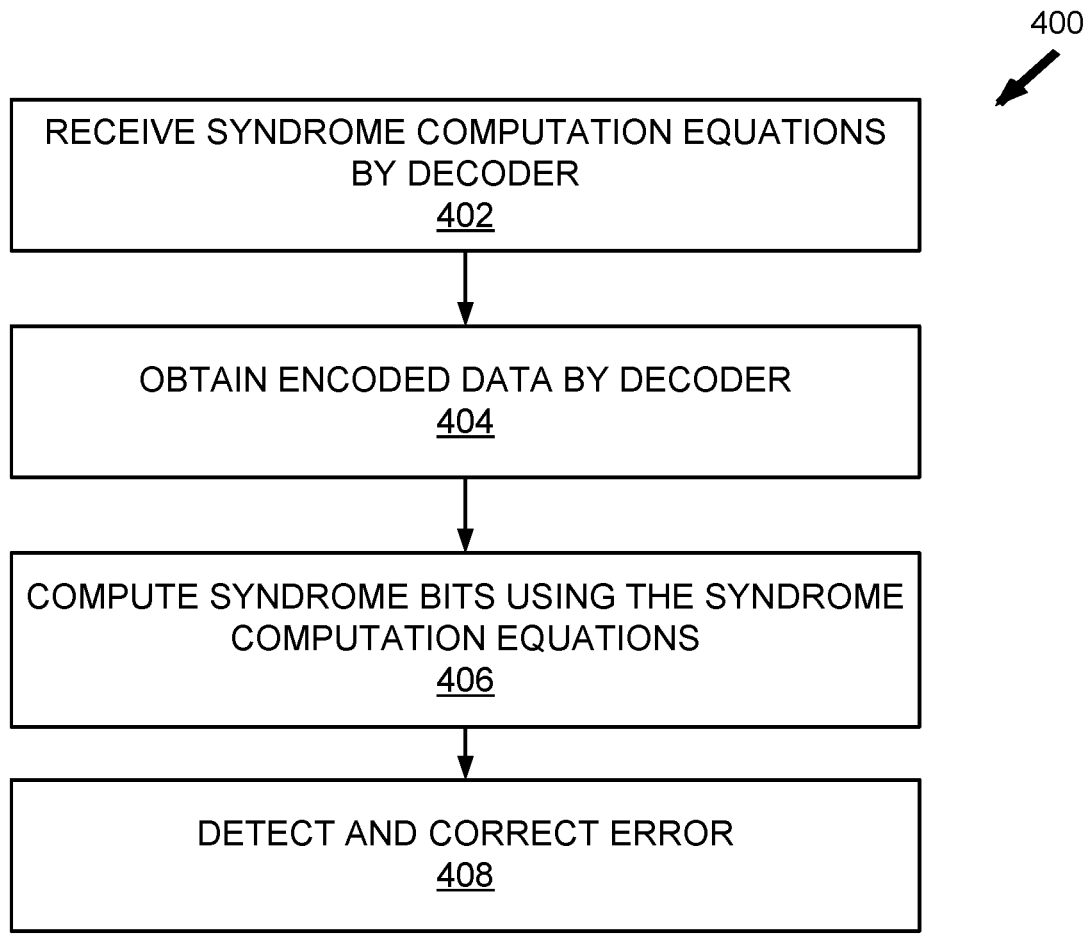
FIG. 4 is a flow diagram illustrating an exemplary method for performing a decoding method according to some embodiments of the present disclosure.
Figure 5:
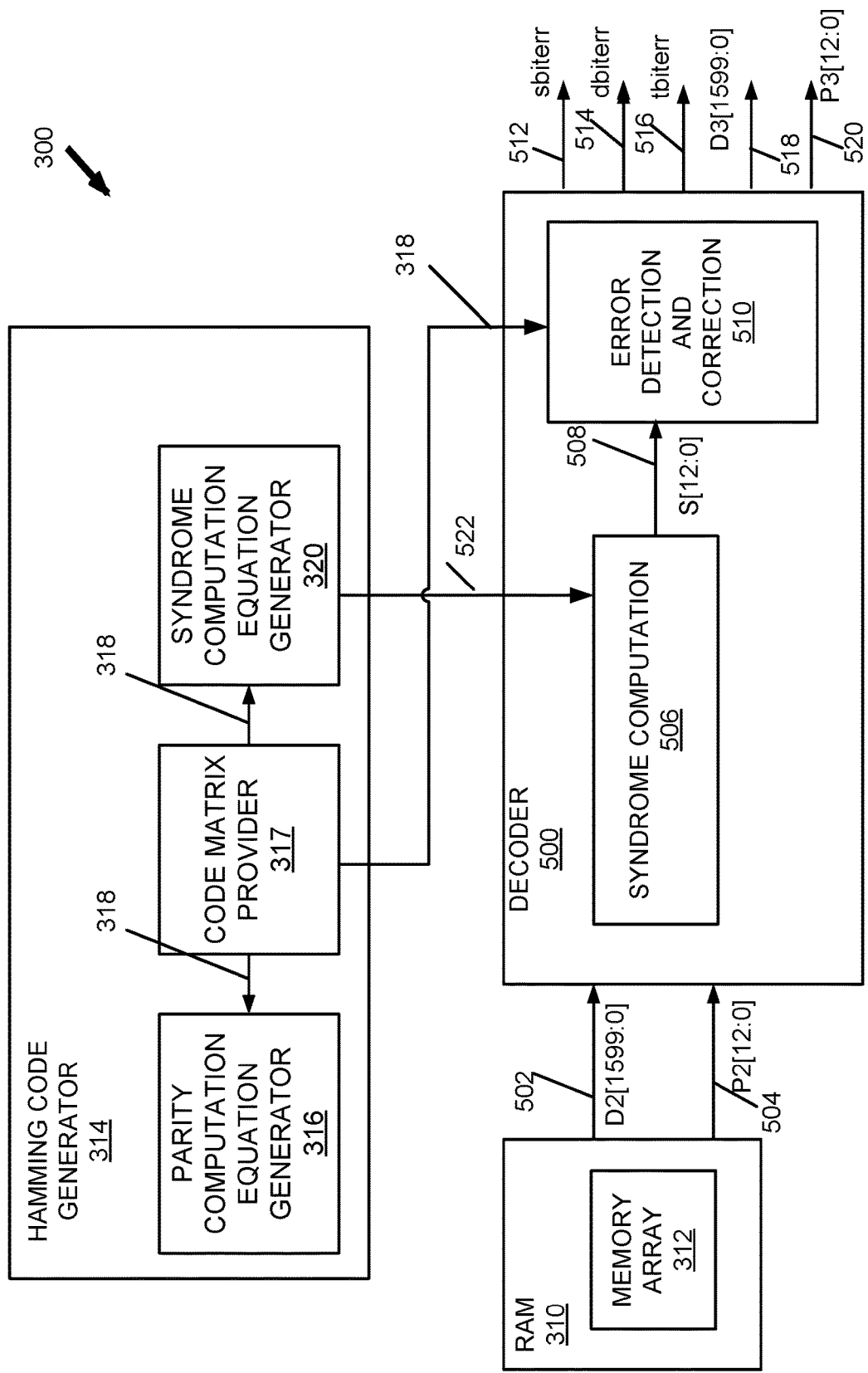
FIG. 5 is a block diagram illustrating an exemplary embodiment of a portion of an ECC memory system according to some embodiments of the present disclosure.
Figure 6:
FIG. 6 is a table illustrating error detect and correct states according to some embodiments of the present disclosure.
Figure 7:
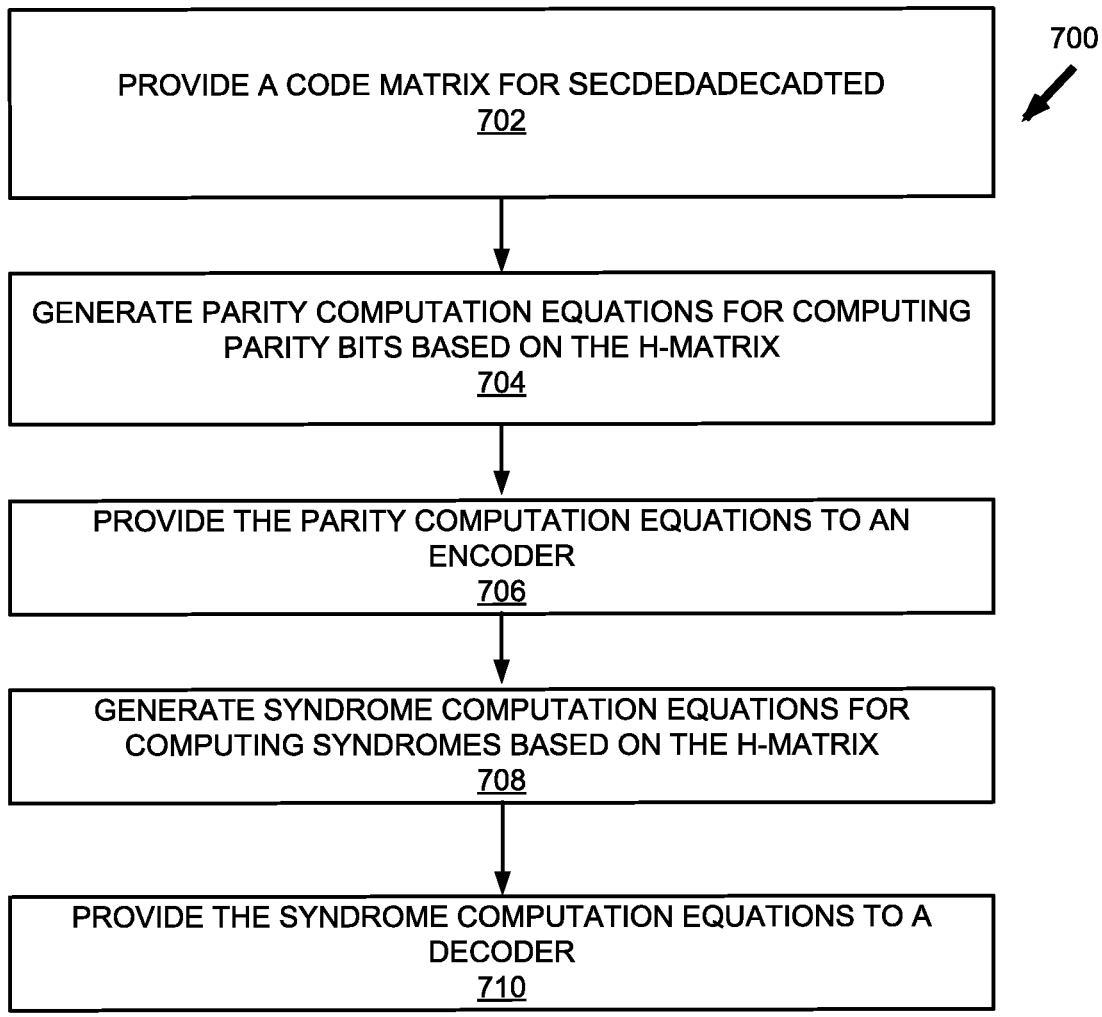
FIG. 7 is a flow diagram illustrating an exemplary method for generating parity computation equations and syndrome computation equations according to some embodiments of the present disclosure.

Referring to FIGS. 4, 5, and 6, an embodiment of a decoding method 400 using the SECDEDADECADTED Hamming code (1613, 1600) is described. Referring to FIG. 4, the method 400 begins at block 402, where a decoder receives syndrome computation equations of the Hamming code (1613, 1600). Referring to FIG. 5, an ECC memory system 300 includes a Hamming code generator 314, an encoder 301, and a memory 310. The syndrome computation equation generator 320 of the Hamming code generator 314 generates syndrome computation equations 522 based on the code matrix 318, and provides the syndrome computation equations 522 to the decoder 500. At block 402, the syndrome computation unit 506 of the decoder 500 receives the syndrome computation equations 522 from the syndrome computation equation generator 320. In the example of FIG. 5, the Hamming code (1613, 1600) uses 13 syndrome bits, and 13 syndrome computation equations 522 are provided for computing the 13 syndrome bits respectively.

The method 400 may then proceed to block 404, where the decoder obtains encoded data. Referring to FIG. 5, at block 204, the decoder 500 obtains encoded data including data bits D2[1599:0] from a signal 502 and parity bits P2[12:0] from a signal 504. In some embodiments, the encoded data is read from the memory array 312 of the memory 310 during a read operation, and may also be referred to as read data.

The method 400 may then proceed to block 406, where syndrome bits are computed based on the syndrome computation equations 522, the read data D2[1599:0] and P2[12:0]. Referring to FIG. 5, in the decoder 500, the syndrome computation unit 506 may compute syndrome bits based on the syndrome computation equations 522. In the example of FIG. 5, 13 syndrome bits S[12:0] are computed using the syndrome computation equations 522, the read data D2[1599:0] and P2[12:0].

The method 400 may then proceed to block 408, wherein errors in the read data are detected and corrected where applicable. Referring to FIG. 5, the syndrome computation unit 506 may send a signal 508 including the syndrome bits S[12:0] to an error detection and correction unit 510. Further, the Hamming code generator 314 may send a code matrix 318 to the error detection and correction unit 510. Based on the syndrome bits S[12:0] and the code matrix 318, the error detection and correction unit 510 may generate error status signals 512, 514, and 516 to indicate the error status of the read data. For example, the error status signal 512 may provide a sbiterr bit to indicate whether a single bit error is detected and corrected, and may also be referred to as a single bit error status signal 512. For further example, the error status signal 514 may provide a dbiterr bit to indicate whether a double bit error is detected or an adjacent double bit error is detected and corrected, and may also be referred to as a double bit error status signal 514. For further example, the error status signal 516 may provide a tbiterr bit to indicate whether an adjacent triple bit error is detected, and may also be referred to as a triple bit error status signal 516.

Referring to FIG. 6, table 600 illustrates the error status 602 associated with different values of the error status signals 512, 514, and 516. In some examples as shown in row 604, the sbiterr bit 512, dbiterr bit 514, and tbiterr bit 516 all have a value of 0. In those examples, an error status 602 indicates that no error is detected. In some examples as shown in row 606, the sbiterr bit 512 has a value of one, and each of dbiterr bit 514 and tbiterr bit 516 has a value of 0. In those examples, an error status 602 indicates that a single bit error is detected and corrected. In some examples as shown in row 608, each of the sbiterr bit 512 and tbiterr bit 516 has a value of 0, and dbiterr bit 514 has a value of one. In that example, an error status 602 indicates that a double bit error is detected or an adjacent-double-bit error is detected and corrected. In yet another example, as shown in row 610, each of the sbiterr bit 512 and dbiterr bit 514 has a value of 0, and the tbiterr bit has a value of one. In that example, an error status 602 indicates that an adjacent-triple bit error is detected but not corrected.

In some embodiments, at block 408, the error detection and correction unit 510 performs error detection and/or correction to the read data D2[1599:0] and P2[12:0] based on the syndrome bits S[12:0], and generates the corrected data bits D3[1599:0] and corrected parity data bits P3[12:0]. The decoder 500 provides the corrected data bits D3[1599:0] at an output 518, and provides the corrected parity data bits P3[12:0] at an output 520.

Figure 12:
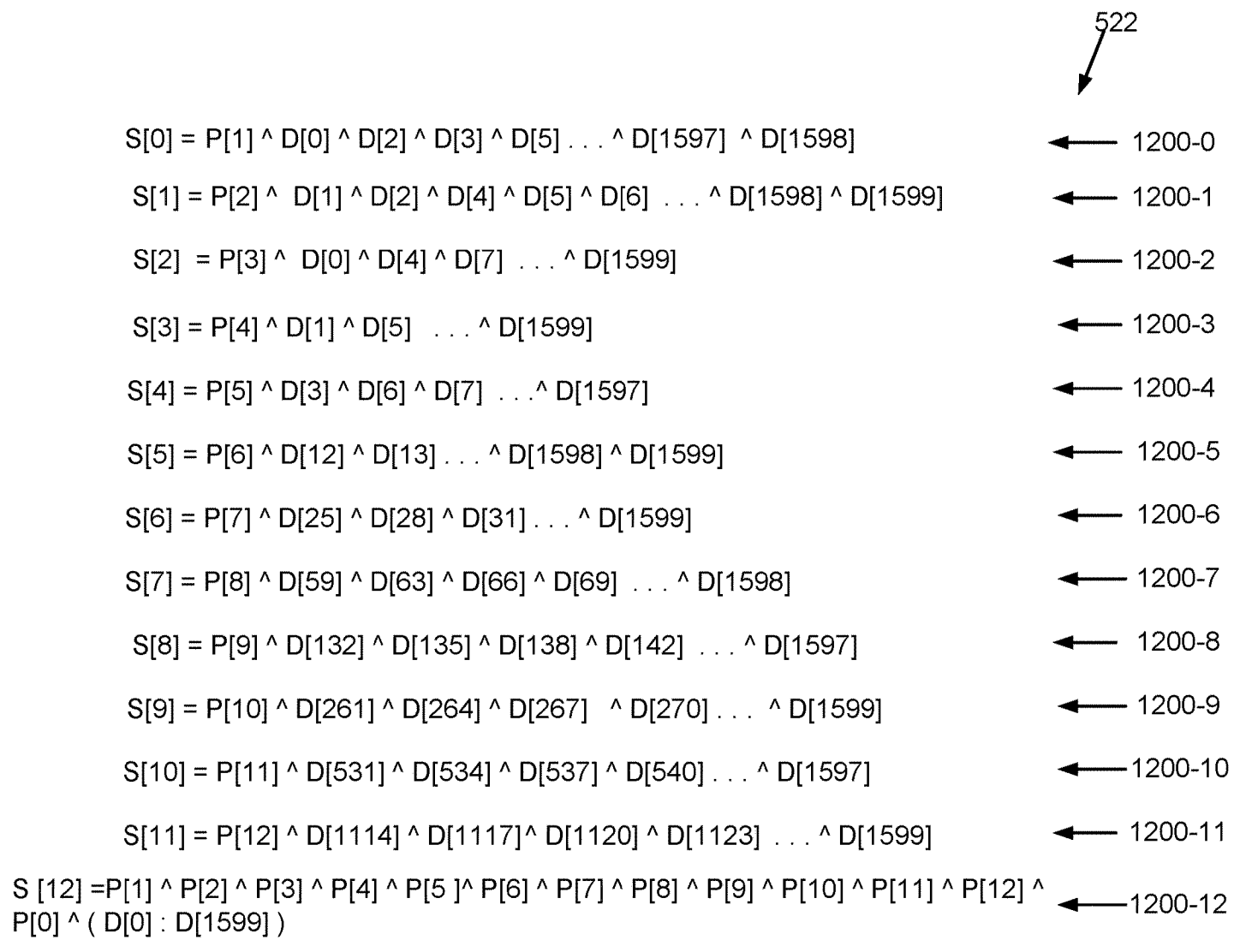
Figure 13:
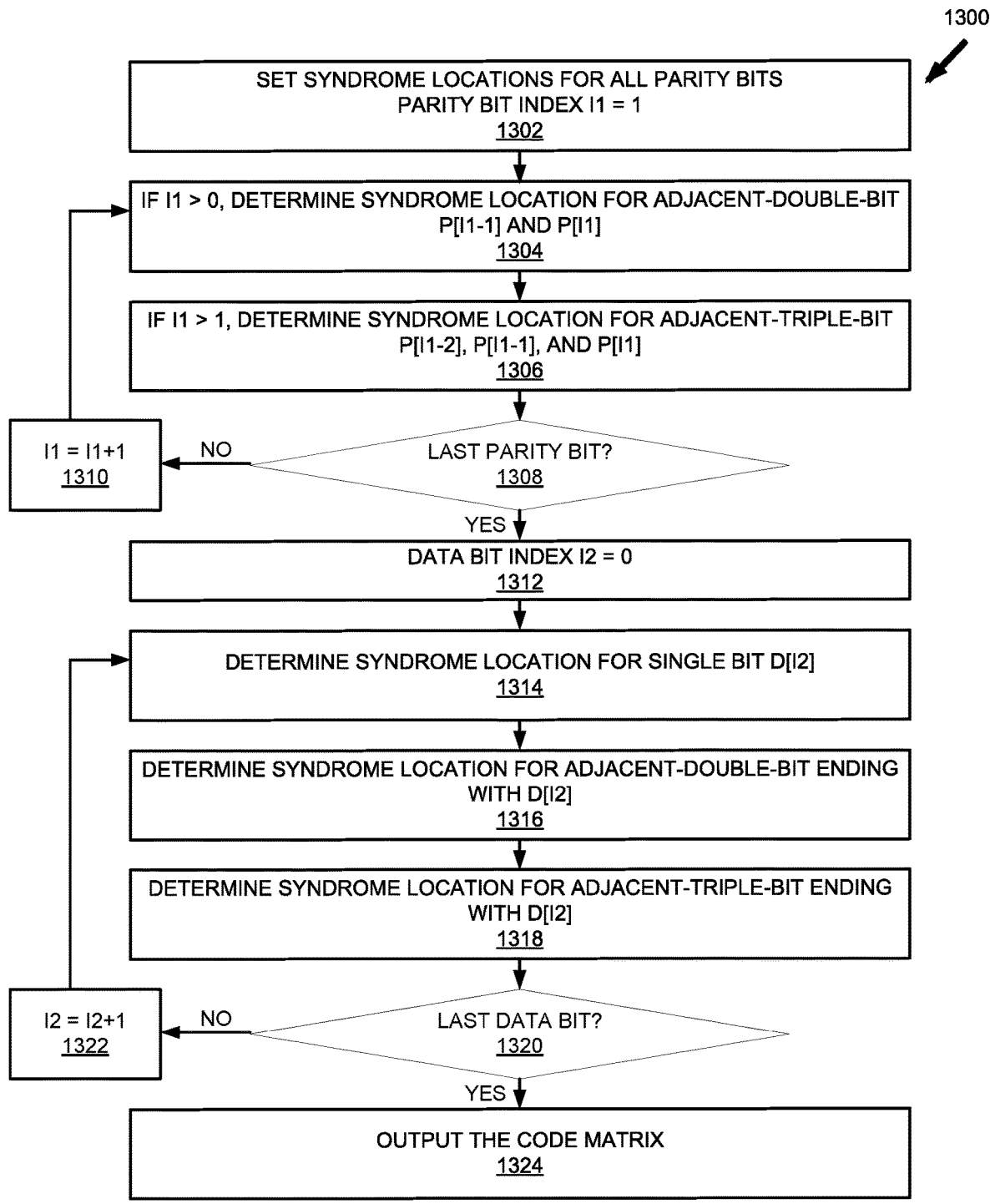
FIG. 13 is a flow diagram illustrating an exemplary method for generating a code matrix according to some embodiments of the present disclosure.

Referring to FIGS. 7-13, embodiments for generating a code matrix and associated parity computation equations and syndrome computation equations are described. FIGS. 7-12 describe a method for generating parity computation equations and syndrome computation equations based on a code matrix for the enhanced Hamming code. FIG. 13 describes a method for generating the code matrix for the enhanced Hamming code.

Figure 8:
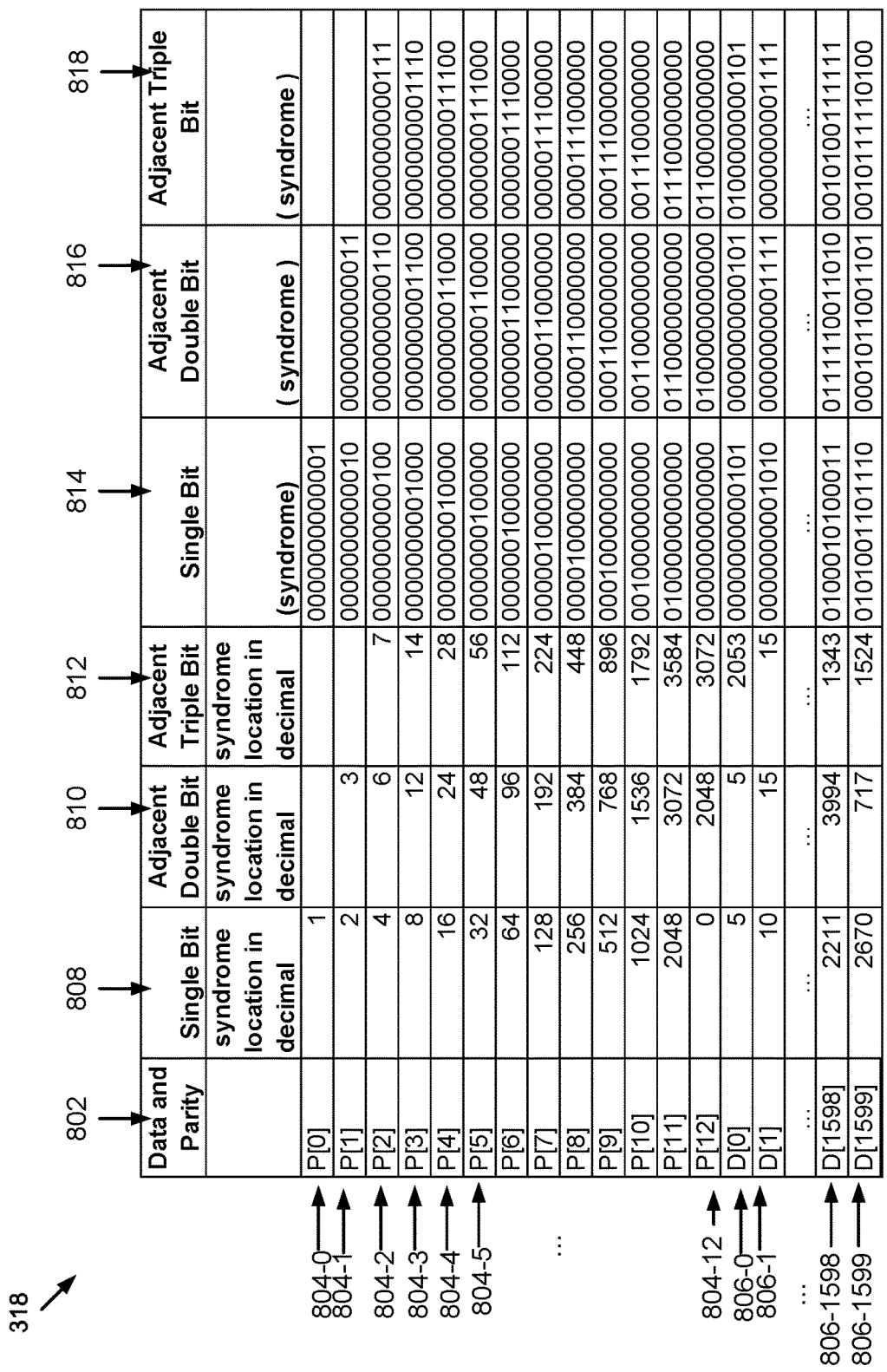
FIG. 8 is a table illustrating a code matrix providing syndrome locations for data bits and parity bits according to some embodiments of the present disclosure.

The method 700 begins at block 702, where a code matrix for SECDEDADECADTED (e.g., code matrix 318) is provided (e.g. by a Hamming code generator 314). Referring to FIG. 8, a code matrix 318 is provided to indicate the syndrome locations for the data bits D[1599:0] and the parity bits P[12:0]. In the example of FIG. 8, the code matrix 318 includes thirteen syndrome bits. One of these thirteen syndrome bits is to distinguish between odd and even number of bits in error, and the other twelve syndrome bits provide a syndrome space having 4096 syndrome locations. The code matrix 318 includes decimal syndrome locations 808, 810, and 812. The syndrome locations 808 corresponds to single bit errors, and may also be referred to as single bit error syndrome locations 808. The syndrome locations 810 corresponds to adjacent double bit errors, and may also be referred to as adjacent double bit error syndrome locations 810. The syndrome locations 812 corresponds to adjacent triple bit errors, and may also be referred to as adjacent triple bit error syndrome locations 812.

In the example of FIG. 8, as shown in rows 804-0 through 804-11, a parity bit P[i] is located at a syndrome location 808 having a value of $2^i$, where i is an integer equal to or greater than 0 but less than 12. As shown in row 804-12, the parity bit P[12] is located at the syndrome location of 0. Rows 806-0 through 806-1599 provide the syndrome locations of the data bits D[1599:0] respectively.

As shown in columns 808, 810, and 812 of FIG. 8, the syndrome locations of D[1599:0] and P[12:0] in decimal are provided such that they satisfy the six syndrome conditions for the SECDEDADECADTED Hamming code (1613, 1600).

As shown in FIG. 8, columns 814, 816, and 818 are the syndrome generated based on the corresponding syndrome locations 808, 810, and 812 respectively. In the example of FIG. 8, syndromes in columns 814, 816, and 818 are binary representations of the syndrome locations 808, 810, and 812 respectively, and may be referred to as single bit error syndrome 814, adjacent double bit error syndrome 816, and adjacent triple bit error syndrome 818 respectively.

Figure 9:
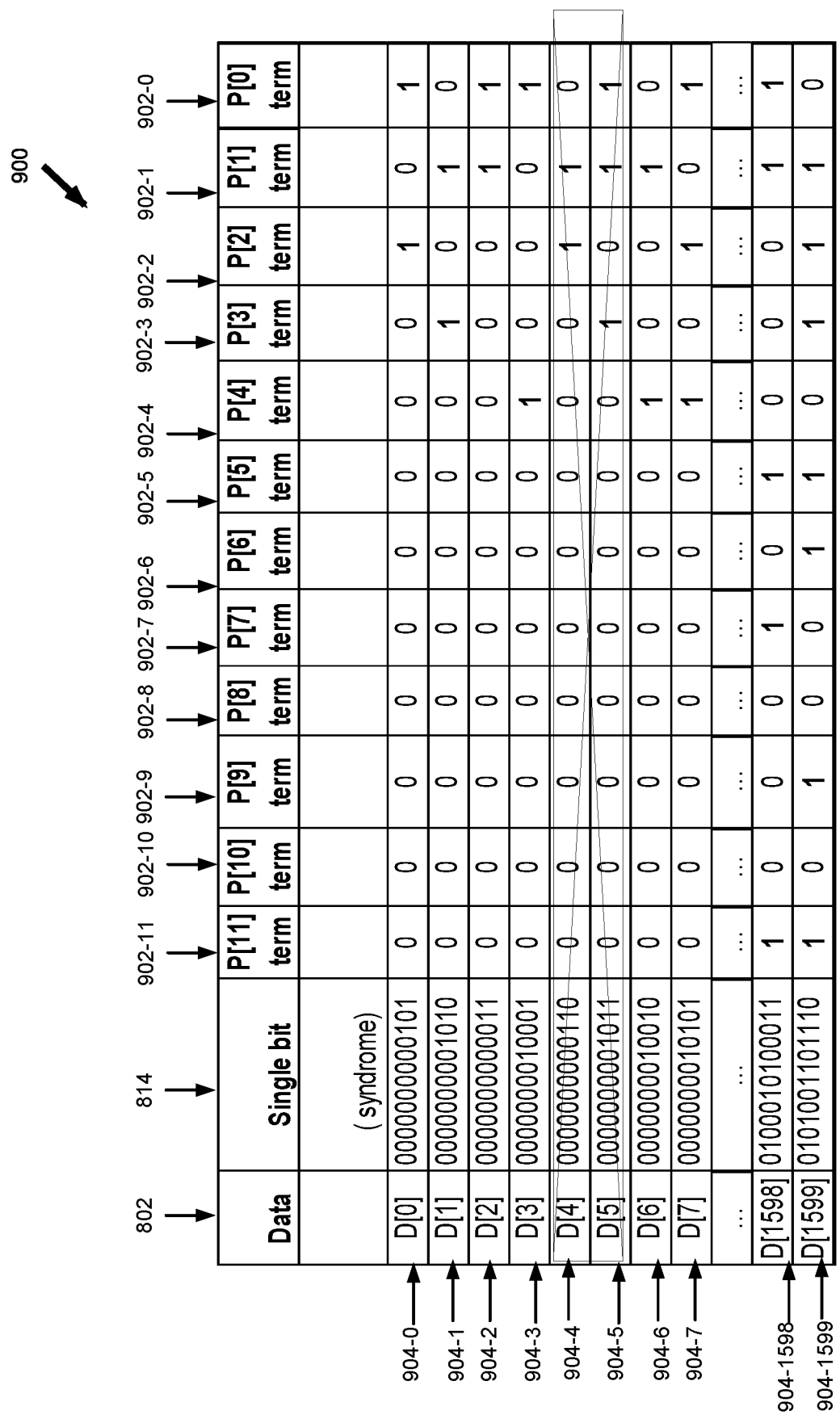
FIG. 9 is a table illustrating parity terms for parity computation equations according to some embodiments of the present disclosure.

The method 700 may then proceed to block 704, where a parity computation equation generator 316 of the Hamming code generator 314 may generate parity computation equations 322 for computing parity bits based on the code matrix 318. Referring to FIG. 9, for each data bit D[i] where i is an integer between zero and 1599, the parity computation equation generator 316 determines parity terms 902-0 through 902-11 corresponding to P[0] through P[11] respectively based on the single bit error syndrome 814 (e.g., generated based on the syndrome location 808). In an example, as shown in row 904-0 of the table 900, the data bit D[0] corresponds to single bit error syndrome 814 of S1[0,0,0,0,0,0,0,0,0,0,1,0,1] for a single bit error of the data bit D[0]. In that example, for the data bit D[0], the parity term 902-i has the same value as SIS[i], where i is an integer between 0 and 11. In other words, for the data bit D[0], the parity term 902-0 has a value of S1[0] ("1"), the parity term 902-1 has a value of S1[1] ("0"), the parity term 902-2 has a value of S1[2] ("1") and so on. In another example, as shown in row 904-1599, the data bit D[1599] corresponds to S1[0, 1, 0, 1, 0, 0, 1, 1, 0, 1, 1, 1, 0] for a single bit error of the D[1599]. In that example, for the data bit D[1599], the parity term 902-0 has a value of S1[0] ("0"), the parity term 902-1 has a value of S1[1] ("1"), the parity term 902-2 has a value of S1[2] ("1") and so on.

Figure 10:
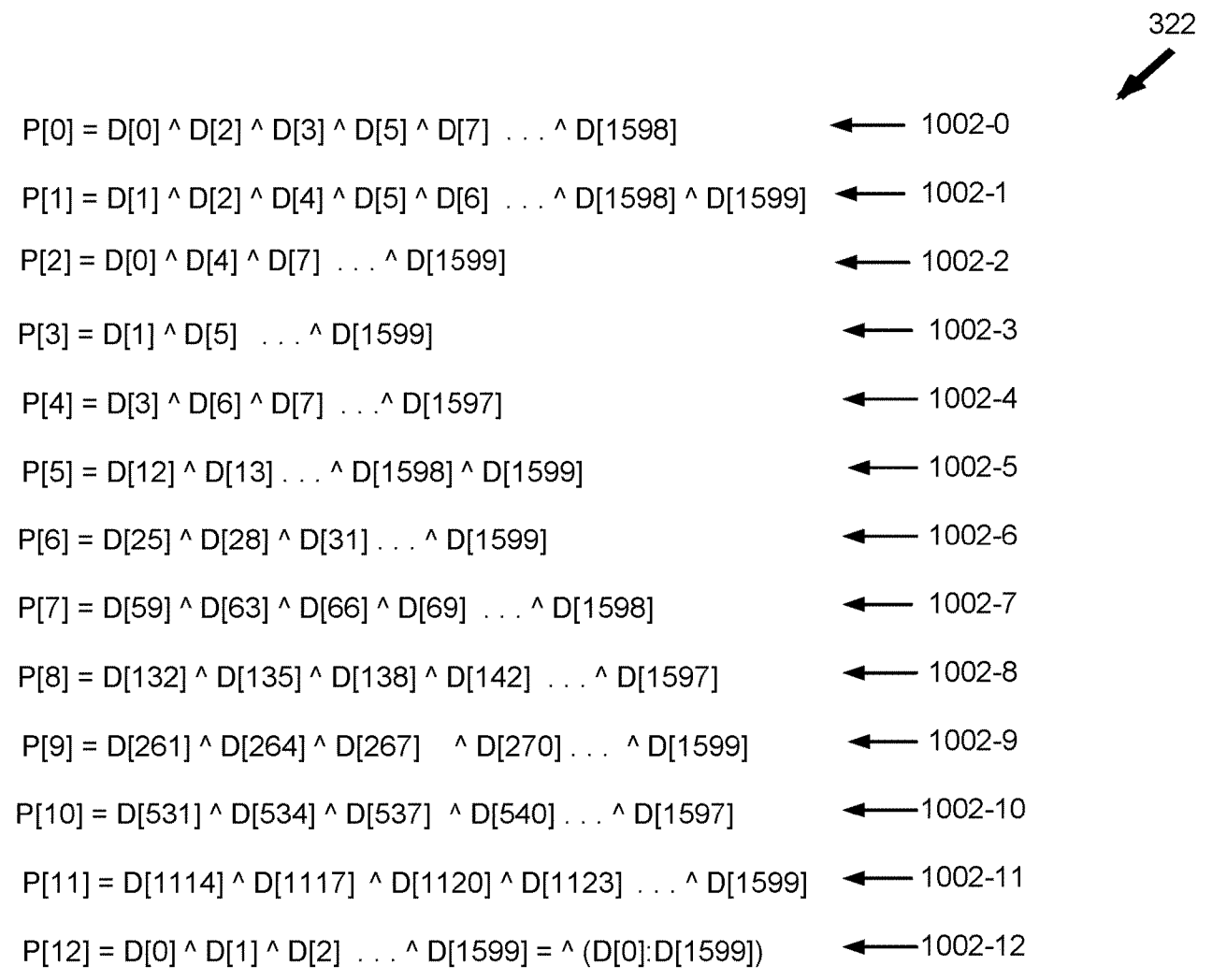

In some embodiments, the parity computation equation generator 316 generates the parity computation equations 322 based on the parity terms 902-0 through 902-11 for each of the data bits D[1599:0]. A parity bit P[i], where i is between 0 and 11, may be computed by performing XOR to all the data bits that have a value of "1" in the corresponding parity term 902-i. For example, the parity bit P[0] may be computed by performing XOR to all the data bits (e.g., D[0], D[2], D[3], D[5], D[7], . . . , [D1598]) that have "1" in the corresponding parity term 902-0. Referring to FIG. 10, illustrated is a list of parity computation equations 322 generated based on the parity terms 902-0 through 902-11 for each of the data bits D[1599:0]. As shown in the parity computation equation 1002-12, the parity bit P[12] (also referred to as global parity bit P[12]) may be computed by performing XOR to all data bits D[1599:0].

The method 700 may then proceed to block 706, where the parity computation equation generator 316 provides the parity computation equations 322 to an encoder (e.g., encoder 301 of FIG. 3).

Figure 11:
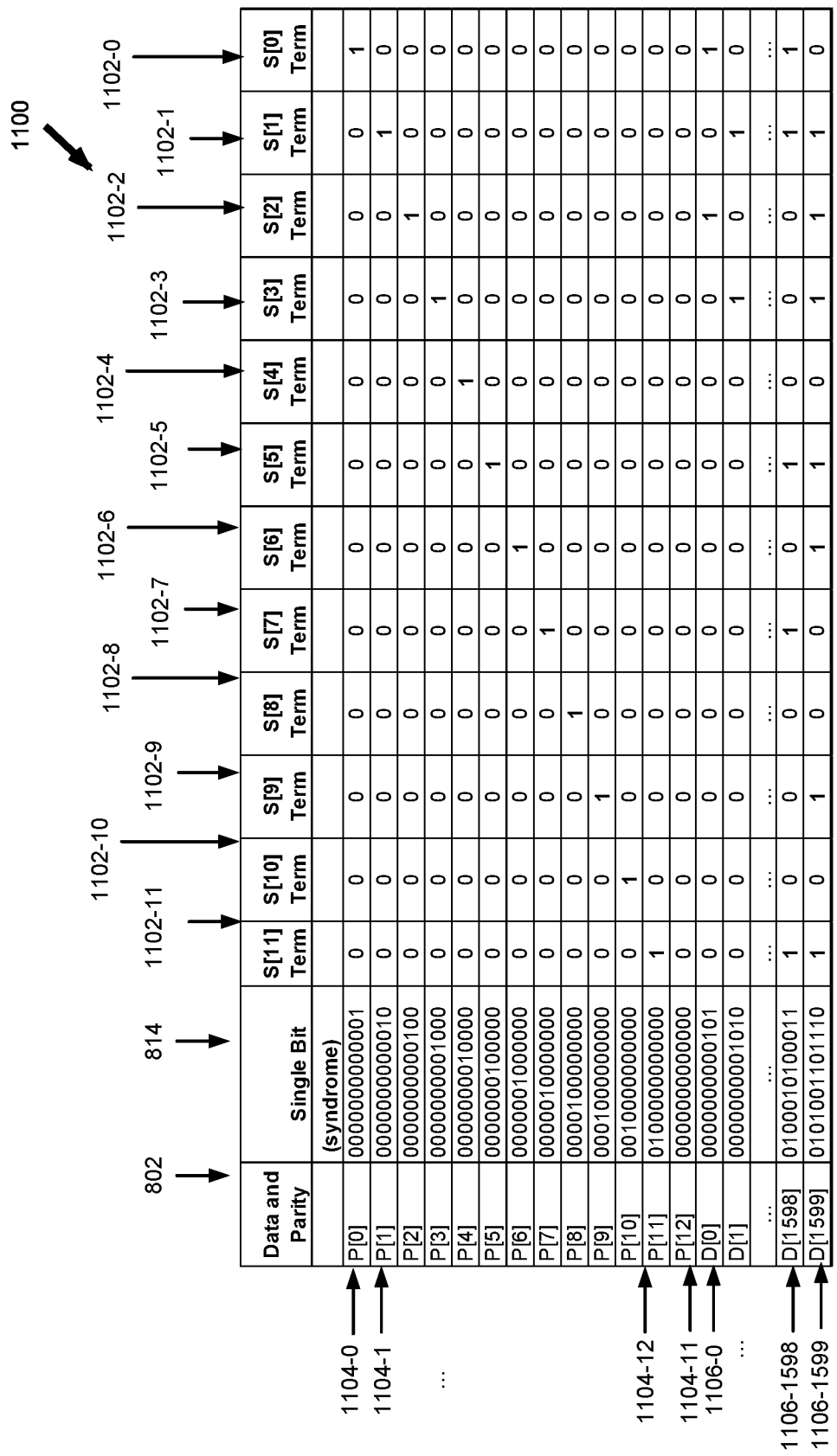
FIG. 11 is a table illustrating syndrome terms for syndrome computation equations according to some embodiments of the present disclosure.

The method 700 may then proceed to block 708, where a syndrome computation equation generator 320 of the Hamming code generator 314 may generate syndrome computation equations 522 for computing syndrome bits based on the code matrix 318. Referring to FIG. 11, for each of the parity bits P[12:0] and data bits D[1599:0], the syndrome computation equation generator 320 determines syndrome terms 1102-0 through 1102-11 based on the single bit error syndrome 814 (e.g., generated based on the syndrome location 804). In an example, as shown in row 1104-0 and column 814 of the table 1100, the parity bit P[0] corresponds to S1[0, 0, 0, 0, 0, 0, 0, 0, 0, 0, 0, 1]. In that example, for the parity bit P[0], the syndrome term 1102-i has the same value as S1[i], where i is an integer between 1 and 11. In other words, for the parity bit P[0], the syndrome term 1102-0 has a value of S1[0] ("1"), the syndrome term 1102-1 has a value of S1[1] ("0"), and so on. In another example, as shown in row 1106-0 and column 814 of the table 1100, the data bit D[0] corresponds to S1[0,0,0,0,0,0,0,0,0,1,0, 1]. In that example, for the data bit D[0], the syndrome term 1102-0 has a value of S1[0] ("1"), the syndrome term 1102-1 has a value of S1[1] ("0"), the syndrome term 1102-2 has a value of S1[2] ("1"), and so on. In yet another example, as shown in row 1106-1599, the data bit D[1599] corresponds to S1[0,1,0,1,0,0,1,1,0,1,1,1,0]. In that example, for the data bit D[1599], the syndrome term 1102-0 has a value of S1[0] ("0"), the syndrome term 1102-1 has a value of S1[1] ("1"), the syndrome term 1102-2 has a value of S1[2] ("1"), and so on.

In some embodiments, the syndrome computation equation generator 320 generates the syndrome computation equations 522 based on the syndrome terms 1102-0 through 1102-11 for each of the parity bits P[12:0] and data bits D[1599:0]. A syndrome bit S[i], where i is between 0 and 11, may be computed by performing XOR to all the parity bits and data bits that have a value of "1" in the corresponding syndrome term 1102-i. For example, the syndrome bit S[0] may be computed by performing XOR on all the parity bits (e.g., P[0]) and data bits (e.g., D[0], D[2], D[3], D[5], D[7], . . . , [D1598]) that have "1" in the corresponding syndrome term 1102-0. Referring to FIG. 12, illustrated is a list of syndrome computation equations 522 generated based on the syndrome terms 1102-0 through 1102-11 for each of the parity bits P[12:0] and data bits D[1599:0]. As shown in the syndrome computation equation 1200-12, the syndrome bit S[12] may be computed by performing XOR to all parity bits P[12:0] and data bits D[1599:0].

The method 700 may then proceed to block 710, where the syndrome computation equation generator 320 provides the syndrome computation equations 522 to a decoder (e.g., decoder 500 of FIG. 5).

Referring to FIG. 13, illustrated is a method 1300 for generating an SECDEDADECADTED code matrix (e.g., code matrix 318) for an enhanced Hamming code (1613, 1600). The method 1300 begins at block 1302, where a code matrix provider (e.g., code matrix provider 317 of FIG. 3) sets syndrome locations for all parity bits. The syndrome locations are determined such that all the six syndrome conditions discussed above are satisfied. Referring to the example of FIG. 8, column 802 illustrates the order of the parity bits and the data bits in the 1613-bit word. As shown in the example of FIG. 8, parity bits P[i] and P[i+1] are adjacent to each other, where i is an integer between 0 and 11. Data bits D[i] and D[i+1] are adjacent to each other, where i is an integer between 0 and 1598. Parity bit P[12] is adjacent to data bit D[0]. At block 1302, the code matrix provider 317 may set a syndrome location 808 for each of the parity bits P[12:0]. In an example, each of the parity bits P[12:0] has a fixed syndrome location 808. For example, P[i] has a syndrome location of $2^i$, where i is an integer between 0 and 11. For further example, P[12] has a syndrome location of 0. At block 1302, the code matrix provider 317 may also set the parity bit index i1 to zero.

The method 1300 may then proceed to block 1304, where the code matrix provider 317 determines syndrome locations 810 for adjacent-double-bit errors for parity bits where the parity bit index i1 is greater than 0. As shown in row 804-0 and column 810 of code matrix 318 of FIG. 8, in an example where parity bit index i1 is equal to 0, block 1304 may be skipped such that syndrome location is not assigned to adjacent double bits as no parity bit proceeds P[0]. As shown in row 804-1 and column 810 of code matrix 318 of FIG. 8, in another example where parity bit index i1 is equal to 1, at block 1304, a syndrome location 810 having a value of 3 is assigned to adjacent double bit P[0] and P[1]. Such a syndrome location may be used by a decoder to detect and correct adjacent-double-bit error of P[0] and P[1]. In a particular example, an error detection and correction unit 510 of FIG. 5 may determine a decimal syndrome of 3 based on S[12:0], and determine that P[12] equals 0, which indicates even bits are in error. In that particular example, the error detection and correction unit 510 detects an adjacent-double-bit error of P2[0] and P2[1], flip those two bits to generate P3[0] and P3[1] respectively, and outputs P3[0] and P3[1] (now error free) in signal 520.

The method 1300 may then proceed to block 1306, where the code matrix provider 317 determines syndrome locations 812 for adjacent-triple-bit errors for parity bits where the parity bit index i1 is greater than 1. As shown in rows 804-0 and 804-1 of code matrix 318 of FIG. 8, in examples where parity bit index i1 is equal to 0 or 1, block 1306 may be skipped. In those examples, a syndrome location is not assigned to adjacent-triple-bit errors for parity bit P[0] or P[1] because there are less than two parity bits proceed P[0] or P[1]. As shown in row 804-2 and column 812 of code matrix 318 of FIG. 8, in another example where parity bit index i1 is equal to two, at block 1304, a syndrome location 812 having a value of 7 is assigned to adjacent-triple-bit errors where each of P[0], P[1], and P[2] is in error. A decoder to detect an adjacent-triple-bit error may use such a syndrome location. In a particular example, an error detection and correction unit 510 of FIG. 5 may determine a decimal syndrome of 7 based on S[12:0], and determine that P[12] equals 1, which indicates that odd bits are in error. In that particular example, the error detection and correction unit 510 detects an adjacent-triple-bit error, and provide tbiterr having a value of 1 in the signal 516.

The method 1300 may then proceed to block 1308 to determine whether the parity bit index i1 has reached the last parity bit (e.g., 12). In some embodiments, at block 1308 the code matrix provider 317 determines that the parity bit index i1 is less than 12. In those embodiments, the method 1300 proceeds to block 1310 to increases the parity bit index i1 by one, and then proceeds to block 1304 for assigning single bit error syndrome location 808, adjacent double bit error syndrome location 810, and adjacent triple bit error syndrome location 812 associated with that next parity bit.

In some embodiments, at block 1308, the code matrix provider 317 determines that the parity bit index i1 has reached the last parity bit. In those embodiments, the method 1300 proceeds to block 1312 to set a data bit index i2 to 0. The method 1300 may then proceed to block 1314, where the code matrix provider 317 determines single bit error syndrome location 808 for the data bit D[i2].

The method 1300 may then proceed to block 1316, where the code matrix provider 317 determines adjacent double bit error syndrome location 810 for the data bit D[i2] and the bit proceeding the data bit D[i2]. In an example where i2 is 0, adjacent double bit error syndrome location 810 is assigned to adjacent double bits P[12] and D[0]. In an example where i2 is greater than 0, adjacent double bit error syndrome location 810 is assigned to adjacent double bits D[i2-1] and D[i2].

The method 1300 may then proceed to block 1318, where the code matrix provider 317 determines adjacent triple bit error syndrome location 812 for the data bits D[i2] and the two bits proceeding the data bit D[i2]. In an example where i2 is 0, an adjacent triple bit error syndrome location 812 is assigned to adjacent triple bits P[11], P[12], and D[0]. In an example where i2 is 1, an adjacent triple bit error syndrome location 812 is assigned to adjacent triple bits P[12], D[0], and D[1]. In an example where i2 is greater than 1, an adjacent triple bit error syndrome location 812 is assigned to adjacent triple bits D[i2-2], D[i2-1], and D[i2].

The method 1300 may then proceed to block 1320, where the code matrix provider 317 determines whether the data bit index i2 has reached the last data bit (e.g., D[1599]). In some embodiments, at block 1320, the code matrix provider 317 determines that the data bit index i2 has not reached the last data bit. In those embodiments, the method 1300 may proceed to block 1322 to increase the data bit index by 1, and then proceed to block 1314 for determining syndrome locations associated with that next data bit.

In some embodiments, at block 1320, the code matrix provider 317 determines that the data bit index i2 has reached the last data bit. In those embodiments, the method 1300 may proceed to block 1324, where the code matrix provider 317 may output the code matrix 318 where all the syndrome locations 808, 810, and 812 have been determined.

In various embodiments, the method 1300 is performed such that the syndrome locations of the code matrix 318 are determined such that all the six syndrome conditions are satisfied.

Regarding the first syndrome condition, in some embodiments, at blocks 1302 and 1314, the syndrome locations 808 are determined according to the first syndrome condition, such that the syndrome location 808 corresponding to each single bit error is unique. In other words, each syndrome location 808 is different from another syndrome location 808. Accordingly, an ECC may detect and correct every single bit error.

Regarding the second syndrome condition, in some embodiments, at blocks 1304 and 1316, the syndrome locations 810 are determined according to the second syndrome condition, such that each syndrome location 810 corresponding to each two-adjacent-bit error is unique. In other words, each syndrome location 810 is different from another syndrome location 810. Accordingly, an ECC may detect and correct every two-adjacent-bit error.

Regarding the third syndrome condition, in some embodiments, at blocks 1306 and 1318, the syndrome locations 812 are determined such that one or more syndrome locations 812 corresponding to triple-adjacent-bit errors may share a common syndrome space (e.g., have same values). Accordingly, an ECC may detect the triple-adjacent-bit errors without correcting it. In some other embodiments, each syndrome location 812 may be different from another syndrome location 812. In those embodiments, an ECC may detect and correct each triple-adjacent-bit error.

Regarding the fourth syndrome condition, in some embodiments, at blocks 1302, 1304, 1314 and 1316, the syndrome locations 808 and 810 are determined such that the single bit error syndrome location 808 and the adjacent double bit error syndrome location 810 may share the common syndrome space. In other words, in some embodiments, one or more syndrome locations 808 may have the same value as a syndrome location 810. In those embodiments, an ECC may use a global parity bit (e.g., P[12]) to distinguish the adjacent double bit error (e.g., where P[12] is 0 and indicates that even bits are in error) with the single bit error (e.g., where P[12] is 1 and indicates that odd bits are in error), where a single bit error syndrome location 808 and an adjacent double bit error syndrome location 810 have the same value.

Regarding the fifth syndrome condition, at blocks 1302, 1306, 1314, and 1318, the syndrome locations 808 and 812 are determined such that the adjacent triple bit error syndrome locations 812 do not share a common syndrome space with the single bit error syndrome locations 808. In other words, none of the adjacent triple bit error syndrome locations 812 has the same value as a single bit error syndrome location 808. Accordingly, an ECC may detect and correct every single bit error, and detect every adjacent triple bit error.

Regarding the sixth syndrome condition, at blocks 1304, 1306, 1316 and 1318, the syndrome locations 810 and 812 are determined such that the adjacent double bit error syndrome location 810 and adjacent triple bit error syndrome location 812 may share the common syndrome space. In other words, in some embodiments, one or more syndrome locations 810 may have the same value as a syndrome location 812. In those embodiments, an ECC may use a global parity bit (e.g., P[12]) to distinguish the adjacent double bit error (e.g., where P[12] is 0 and indicates that even bits are in error) with the adjacent triple bit error (e.g., where P[12] is 1 and indicates that odd bits are in error), where the adjacent double bit error syndrome location 810 and the adjacent triple bit error syndrome location 812 have the same value.

In various embodiments, N:1 column multiplexing may be used in an ECC memory system to help to correct N consecutive bit errors in N different words in N clock cycles, where N is an integer (e.g., 4, 8). In an example where an SEU event upsets more than N but less than 2N+1 consecutive SLCs of the memory, an ECC memory system using a conventional Hamming code or a single-extended Hamming code may only detect double bit errors and cannot correct them. However, such an SEU may result in a minimum of one set of adjacent double bit error and a maximum of N sets of adjacent double bit errors. By using the enhanced Hamming code (e.g., Hamming code (1613, 1600)), N sets of adjacent double bit errors may be detected and corrected in N clock cycles. In another example where an SEU event upsets more than 2N but less than 3N+1 consecutive SLCs of the memory, such an SEU event may result in a minimum of one set of triple-adjacent-bit errors and a maximum or N sets of triple-adjacent-bit errors. By using the enhanced Hamming code (e.g., Hamming code (1613, 1600)), N sets of triple-adjacent-bit errors may be detected in N clock cycles.

In various embodiments, using the enhanced Hamming code (e.g., Hamming code (1613, 1600)) cause minimum or no area impact compared to using the conventional Hamming code Hamming code (1611, 1600), a single-extended Hamming code Hamming code (1612, 1600), or two Hamming code (811, 800). First, compared to the single-extended Hamming code (1612, 1600), the enhanced Hamming code (1613, 1600) uses one extra parity, which may grow the memory array word size by one bit. Second, compared to using two Hamming code (811, 800) to correct two bit errors which requires 22 parity bits, by using the enhanced Hamming code (1613, 1600) having 13 parity bits, a saving of 9 parity bits is achieved. Third, compared to the single-extended Hamming code (1612, 1600), the enhanced Hamming code (1613, 1600) calculates one extra syndrome bit, which may cause an area impact of 1/13 (7%). Fourth, by using the enhanced Hamming code, the usage of XOR gates in both encoder and decoder is reduced by about 30%. As such, overall using the enhanced Hamming code (e.g., Hamming code (1613, 1600)) causes minimum or no area impact.

It is noted that various configurations illustrated in FIGS. 2 to 13 are exemplary only and not intended to be limiting beyond what is specifically recited in the claims that follow. It will be understood by those skilled in that art that other configurations may be used. For example, the enhanced Hamming code may include different numbers of data bits and parity bits, and may be used in a memory that has a word width that is either less than 1600 bits or greater than 1600 bits. For further example, while exemplary parity computation equations and syndrome computation equations are provided, other equations for computing the parity bits and syndrome bits may be used. For further example, the embodiments may be extended to using an enhanced Hamming code to detect and correct adjacent-triple-bit errors and detect adjacent-quadruple-bit errors.

In various embodiments, the ECC memory system 300 and each of its components may be implemented in hardware, software, or a combination of hardware and software. For example, the Hamming code generator 314, encoder 301, decoder 500, and each of their blocks may be implemented using a computer system with a processor and memory configured to execute software, or as an application specific integrated circuit, that are configured to perform the operations described herein. In some embodiments, the Hamming code generator 314, encoder 301, decoder 500, and each of their blocks may be implemented as a circuit within a field programmable gate array (FPGA), such as the FPGA described below with respect to FIG. 1.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A system, comprising:
   a Hamming code generator circuit configured to provide a code matrix for a single error correct double error detect adjacent double error correct adjacent triple error detect (SECDEDADECADTED) Hamming code,
      wherein the code matrix provides that all parity bits are stored immediately adjacent to each other in a sequential order; and
      wherein the code matrix provides single bit error syndrome locations, adjacent double bit error syndrome locations, and adjacent triple bit error syndrome locations,
         wherein each single bit error syndrome location is different from another single bit error syndrome location;
         wherein each adjacent double bit error syndrome location is different from another adjacent double bit error syndrome location; and
         wherein a first adjacent triple bit error syndrome location has a same value as a second adjacent triple bit error syndrome location;
   an encoder circuit configured to:
      receive a plurality of data bits;
      receive a plurality of parity computation equations based on the code matrix;
      compute a plurality of parity bits for the plurality of data bits using the plurality of parity computation equations; and
      provide write data including the data bits and the parity bits to a write circuit, wherein the write circuit writes the write data to a memory.

2. The system of claim 1, wherein the SECDEDADECADTED Hamming code includes n1 parity bits and m1 data bits,
   wherein n1, m1, and e1 are integers,
   wherein e1 is equal to or greater than 2, and
   wherein $2^{n1-e1}-n1-1>=m1$,
   wherein the code matrix provides that all m1 data bits are stored immediately adjacent to each other in a sequential order.

3. The system of claim 2, further comprising:
a decoder circuit configured to receive read data that are read from the memory, the decoder circuit including:
a syndrome computation circuit configured to:
receive a plurality of syndrome computation equations based on the code matrix;
compute syndrome bits using the plurality of syndrome computation equations and the read data; and
an error detection and correction circuit configured to:
decode the read data to generate decoded read data according to the syndrome bits.

4. The system of claim 3, where the error detect and correction circuit is configured to:
provide one or more error status signals including a single bit error status signal, a double bit error status signal, and a triple bit error status signal.

5. The system of claim 4, wherein the error detection and correction circuit is configured to:
detect a single bit error in the read data and in response, correct the single bit error using the syndrome bits.

6. The system of claim 5, wherein in response to detecting and correcting the single bit error, the error detection and correction circuit is configured to:
provide the single bit error status signal having a value of one;
provide the double bit error status signal having a value of zero; and
provide the triple bit error status signal having a value of zero.

7. The system of claim 6, wherein the error detection and correction circuit is configured to:
detect an adjacent double bit error in the read data and in response, correct the adjacent double bit error using the syndrome bits.

8. The system of claim 7, wherein in response to detecting and correcting the adjacent double bit error, the error detection and correction circuit is configured to:
provide the single bit error status signal having a value of zero;
provide the double bit error status signal having a value of one; and
provide the triple bit error status signal having a value of zero.

9. The system of claim 8, wherein in response to detecting a triple-adjacent-bit error, the error detection and correction circuit is configured to:
provide the single bit error status signal having a value of zero, provide the double bit error status signal having a value of zero; and
provide the triple bit error status signal having a value of one.

10. The system of claim 2, wherein the hamming code generator circuit is configured to:
generate the plurality of parity computation equations based on the code matrix; and
provide, to the encoder circuit, the plurality of parity computation equations.

11. The system of claim 10, wherein the single bit error syndrome locations, adjacent double bit error syndrome locations, and adjacent triple bit error syndrome locations are in an n1-syndrome-bit space,
wherein each single bit error syndrome location is different from another adjacent triple bit error syndrome location.

12. The system of claim 10, wherein the hamming code generator circuit is configured to:

generate a plurality of syndrome computation equations based on the code matrix; and
provide, to a decoder circuit, the plurality of syndrome computation equations for decoding read data read from the memory.

13. A method, comprising:
providing a code matrix for a single error correct double error detect adjacent double error correct adjacent triple error detect (SECDEDADECADTED) Hamming code,
wherein the code matrix provides that all parity bits are stored immediately adjacent to each other in a sequential order, and that all data bits are stored immediately adjacent to each other;
wherein the code matrix provides single bit error syndrome locations, adjacent double bit error syndrome locations, and adjacent triple bit error syndrome locations,
wherein each single bit error syndrome location is different from another single bit error syndrome location;
wherein each adjacent double bit error syndrome location is different from another adjacent double bit error syndrome location; and
wherein a first adjacent triple bit error syndrome location has a same value as a second adjacent triple bit error syndrome location;
receiving, by an encoder circuit, a plurality of data bits;
receiving, by the encoder circuit, a plurality of parity computation equations based on the code matrix;
computing, by the encoder circuit, a plurality of parity bits using the plurality of parity computation equations; and
providing, by the encoder circuit, write data including the data bits and the parity bits to a write circuit, wherein the write circuit writes the write data to a memory.

14. The method of claim 13, wherein the SECDEDA-DECADTED Hamming code includes n1 parity bits and m1 data bits,
wherein n1, m1, and e1 are integers,
wherein e1 is equal to or greater than 2,
wherein $2^{n1-e1}-n1-1>=m1$, and
wherein the code matrix provides that the m1 data bits are stored immediately following the n1 parity bits.

15. The method of claim 14, further comprising:
receiving, by a decoder circuit, read data that are read from the memory;
receiving a plurality of syndrome computation equations based on the code matrix;
computing syndrome bits using the plurality of syndrome computation equations and the read data; and
decoding the read data to generate decoded read data according to the syndrome bits.

16. The method of claim 15, further comprising:
providing one or more error status signals including a single bit error status signal, a double bit error status signal, and a triple bit error status signal.

17. The method of claim 16, further comprising:
detecting an adjacent double bit error in the read data and in response, correcting the adjacent double bit error using the syndrome bits.

18. The method of claim 17, further comprising:
detecting a triple-adjacent-bit error in the read data; and
in response to detecting the triple-adjacent-bit error,
providing the single bit error status signal having a value of zero,
providing the double bit error status signal having a value of zero, and providing the triple bit error status signal having a value of one.

19. The method of claim 14, further comprising:
generating the plurality of parity computation equations based on the code matrix.

20. The method of claim 19, wherein:
the single bit error syndrome locations, the adjacent double bit error syndrome locations, and the adjacent triple bit error syndrome locations are in an n1-syndrome-bit space, and
each single bit error syndrome location is different from another adjacent triple bit error syndrome location.

\* \* \* \* \*